United States Patent [19]

May et al.

[11] 3,987,375
[45] Oct. 19, 1976

[54] TRANSMISSION BRIDGE EXHIBITING REDUCED DISTORTION

[75] Inventors: Peter J. May; Matyas Hugyecz, both of Rochester, N.Y.

[73] Assignee: Stromberg-Carlson Corporation, Rochester, N.Y.

[22] Filed: Mar. 25, 1975

[21] Appl. No.: 561,756

[52] U.S. Cl. .................. 333/8; 333/24 R; 333/32; 333/70 R; 333/78
[51] Int. Cl.[2] ............. H03H 7/04; H03H 7/14; H03H 7/38; H03H 5/12
[58] Field of Search ............ 333/70 R, 32, 24 R, 333/27, 12, 77–79, 1, 4–8; 323/66; 179/170 R, 170 D, 170 E; 338/13, 20, 21, 22 R, 22 SD

[56] References Cited
UNITED STATES PATENTS

| 1,875,156 | 8/1932 | Roberts | 333/81 X |
| 2,085,639 | 6/1937 | Cowan | 333/81 X |
| 2,089,346 | 8/1937 | Doba, Jr. | 323/66 |
| 3,098,195 | 7/1963 | Lennon III, et al. | 323/66 |
| 3,631,333 | 12/1971 | Pichal | 323/66 |
| 3,665,125 | 5/1972 | Valbonesi | 179/170 R |

Primary Examiner—Alfred E. Smith
Assistant Examiner—Marvin Nussbaum
Attorney, Agent, or Firm—William F. Porter, Jr.

[57] ABSTRACT

A telephone transmission bridge including a transformer having primary and secondary windings, connected between first and second input leads and first and second output leads, respectively, has a varistor connected in series with a relatively small number of tertiary windings wound around the transformer core. The tertiary windings and varistor present a high AC impedance to signals transmitted via the input and output leads, thereby permitting AC signals to be transmitted freely via the primary and secondary windings. When transient DC signals are impressed on the input and output leads the tertiary windings and varistor exhibit a low DC impedance, the varistor conducts effectively short circuiting the primary or secondary windings to which the transient signals are transmitted and the transient signals are prevented from being transmitted through the transmission bridge.

4 Claims, 7 Drawing Figures

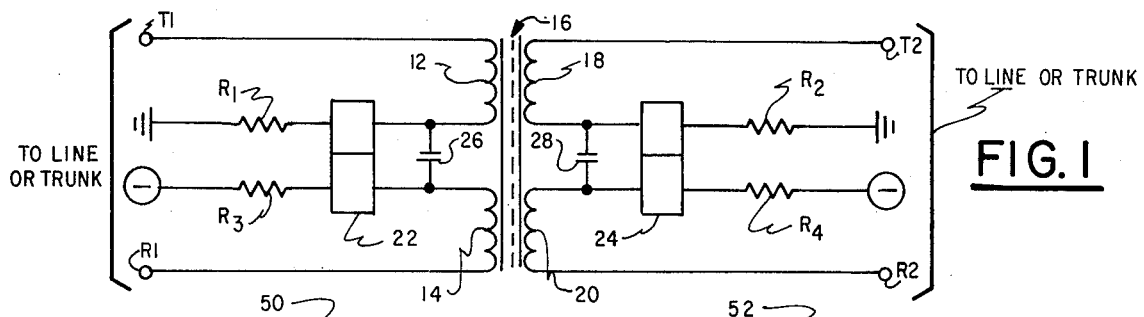
FIG. 1
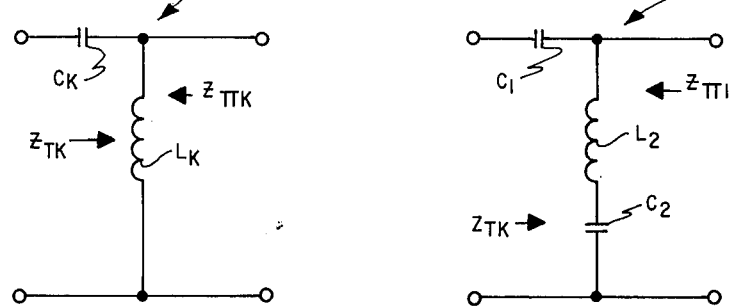
FIG. 2
FIG. 2A    FIG. 2B
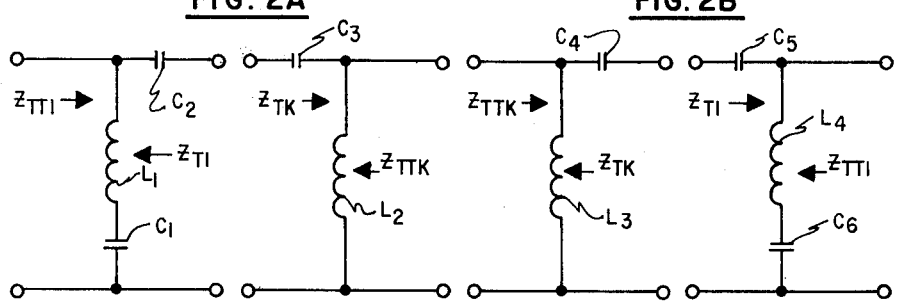
FIG. 3
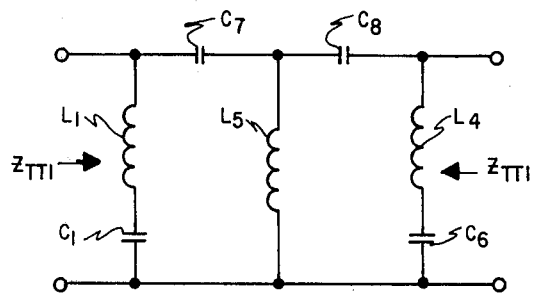
FIG. 4
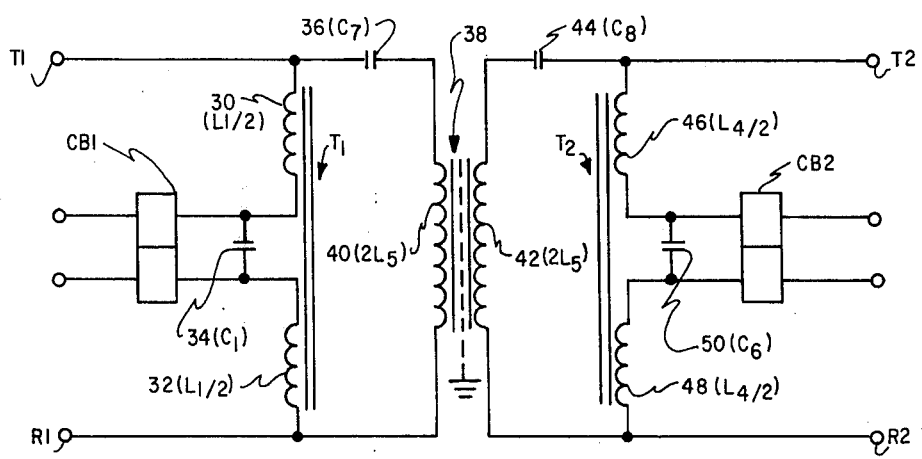
FIG. 5

TRANSMISSION BRIDGE EXHIBITING REDUCED DISTORTION

BACKGROUND OF THE INVENTION

This invention relates generally to transmission circuitry for use in telephone communication systems and more particularly to a new transmission bridge useful in providing voice communication.

Transmission bridges have long been utilized to provide talking paths in 2-wire telephone switching networks and, therefore, have been designed to pass AC signals, while isolating DC voltages which are provided to perform a number of supervisory functions. The design of transmission bridges has been quite functional in the past. Thus, such bridges have in general been basically transformers (for example) which pass AC signals and are sized to suit particular applications. The tip and ring lines in both the primary and secondary sides of the transformer have been connected through the windings to ground and the negative battery, respectively. Capacitors have been installed, in both the primary and secondary between windings connected in the tip circuit and windings connected in the ring circuit in order to provide the required DC isolation.

In older transmission bridges high impedance iron core wound relays were often used in order to satisfy the transmission characteristics of the bridges. In newer bridges, in which relatively lower impedance reed relay sensors (for example) are utilized, repeat coils, which have a large inductance, have been connected between the tip and ring circuits. The use of repeat coils has also permitted the necessary impedance transformations (for example 900:600 ohms between line and trunk circuits).

Such transmission bridges generally have provided adequate service; however, they have exhibited several deficiencies and are expected to be inadequate to meet a number of future requirements. With the advent of direct distance dialing, some line-to-trunk and trunk-to-trunk transmission bridges are required to transmit rotary dial pulses. Often existing transmission bridges have distorted these pulses so that the signals which pass through the bridges have resulted in incorrect connections or no connections at all. Such bridges probably will be inadequate for future data transmission requirements. More important for the present, existing transmission bridges generally exhibit voice transmission characteristics which are less than completely desirable. Generally, the insertion loss in existing bridges is greater than is desired. The frequency of voice signals generally lies in a range between 300 Hz and 3,000 Hz. Typically, the response of an existing transmission bridge is of the order of 2-3 dB down at 300 Hz from that at 1,000 Hz and the response at 3000 Hz is correspondingly further down.

In order to provide optimum transmission characteristics, a transmission bridge should have a low audio insertion loss and exhibit a frequency response curve which is substantially constant over the frequency range corresponding to voice signals. At the same time the response should drop off sharply below 200–300 Hz in order to attenuate the low frequency noise signals which are often present on telephone transmission lines.

Such a transmission bridge should protect the equipment to which it is connected from large current surges and should accommodate both rotary and pushbutton dialing. In addition, such a transmission bridge should be simple, inexpensive and easily manufactured.

Accordingly, its is an object of the present invention to provide a new and improved transmission bridge which exhibits low audio insertion loss and a flat audio frequency response curve and provides rejection to low frequency noise signals.

Another object of the invention is to provide such a transmission bridge which causes very little distortion, thereby accommodating both rotary dial and pushbutton signalling, and demonstrates high longitudinal balance.

Still another object of the invention is to provide such a transmission bridge which provides required impedance transformations and high echo return loss.

A further object of the present invention is to provide such a transmission bridge which protects against current surges due to lightning induction and is simple and inexpensive to manufacture.

SUMMARY OF THE INVENTION

In accordance with the invention, there is provided an improved transmission bridge which is designed by applying image parameter filter theory.

BRIEF DESCRIPTION OF THE DRAWINGS

Other objects, features and advantages of the present invention will become apparent from the following description of a preferred embodiment, taken together with the attached drawings thereof, in which:

FIG. 1 is an electrical schematic diagram showing the general manner of connection of a transmission bridge;

FIGS. 2A and 2B are electrical schematic diagrams showing high pass filter sections which may be utilized in designing a transmission bridge constructed in accordance with the present invention;

FIG. 3 is an electrical schematic diagram showing the high pass filter sections which are to be combined to provide the transmission bridge;

FIG. 4 is an electrical schematic wiring diagram showing the high pass filter which results from the combination of the filter sections of FIG. 3;

FIG. 5 shows a transmission bridge constructed by utilizing the high pass filter shown in FIG. 4.

DESCRIPTION OF THE PREFERRED EMBODIMENT

Figure 6:
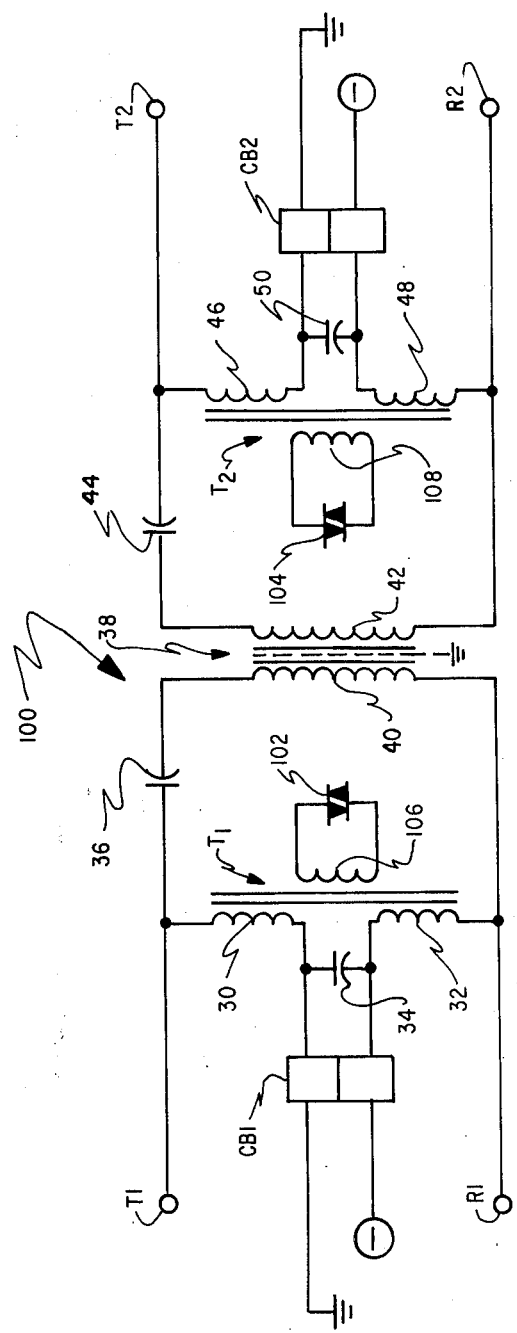
FIG. 6 is an electrical schematic diagram of the transmission bridge of FIG. 5 including protection against dial pulse distortion and high current surges.

Referring now to FIG. 1, there is shown a conventional transformer coupled transmission bridge, generally designated 10, which typically is included as a portion of trunk or local junctor circuitry (which provide connections between two line circuits for local calls and between a line circuit and a trunk circuit for trunk calls) and is utilized to transmit alternating current signals (via a transformer) while isolating direct current signals in the input portion of the circuit from direct current signals in the output portion of the circuit. The transmission bridge 10 includes a pair of primary windings 12 and 14 connected to input tip and ring lines, T1 and R1, respectively, and wound on the core of a transformer 16 having a pair of secondary windings 18 and 20, respectively, connected to output tip and ring lines T2 and R2, respectively. The tip lines, T1 and T2, are connected via suitable resistors, $R_1$ and $R_2$, respectively, and one winding of calling bridge (CB) relays 22 and 24, respectively to ground and the ring lines are connected via suitable resitors $R_3$ and $R_4$ and the other windings of the calling bridge relays 22 and 24, respectively, to a negative voltage supply. Suitable isolating capacitors 26 and 28 are provided between the primary windings 12 and 14 and between the secondary windings 18 and 20, respectively.

Such a transmission bridge 10 transmits AC signals impressed between the tip and ring lead pairs T1, R1 and T2, R2 via the transformer 16, while DC signals impressed on one or more of the tip and ring lines energize one or more of the windings in the CB relays 22 and 24 and the energized relays actuate switches or contact pairs which, for example, permit supervisory functions to be performed. As has been discussed above, a transmission bridge 10 such as that shown in FIG. 1 has been suitable in many applications, but has exhibited — and may be expected to exhibit — a number of deficiencies in other applications.

Preferably a transmission bridge should be capable of accommodating line-to-line connections, line-to-trunk connections and trunk-to-trunk connections and should satisfy a number of requirements simultaneously. Such a bridge should provide a low audio insertion loss, flat audio frequency response, low distortion, high longitudinal balance and provide the requisite impedance transformations between line and trunk connections and provide a high quality of impedance matching. In addition, such a bridge should accomodate rotary dial and multifrequency signaling, protect against current surges due to lightning induction, provide rejection to low frequency noise and be economical and easily reproducible. All of the foregoing requirements may be realized by designing a transmission bridge as a high pass filter structure.

Referring now to FIGS. 2A and 2B, there are shown, respectively, a half K section type filter, generally designated 50, and a half M section type filter, generally designated 52. By combining these filter type sections in the proper manner on an image matching basis to make a composite filter, it is possible to design the transmission bridge required. Since the impedance, $Z_T$, shown in the impedance of the filter section when the section is terminated with its image impedance, $Z_\pi$, the impedances are matched since $Z_{Tk}$ is equal to $Z_{T1}$, and $Z_{\pi 1} = Z_{\pi K}$.

Referring now to FIG. 3, there is shown (from left to right) a half M type section, a half K type section, a second half K type section, and a second half M type section. These sections may be combined into the composit ladder structure shown in FIG. 4.

In combining the filter sections in FIG. 3 into the structure shown in FIG. 4, the values of the capacitors $C_7$ and $C_8$ and the inductance $L_5$ may be determined as follows:

$$C_7 = \frac{C_2 \times C_3}{C_2 + C_3}$$

$$C_8 = \frac{C_4 \times C_5}{C_4 + C_5}$$

$$L_5 = \frac{L_2 \times L_3}{L_2 + L_3}$$

Since, in FIGS. 2A and 2B $$C_K = \frac{1}{W_c R} \quad C_1 = \frac{C_K}{m}$$

$$L_K = \frac{R}{W_c} \quad L_2 = \frac{L_K}{m}$$

$$C_2 = \frac{m}{1 - m^2} C_K$$

where
$W_c = 2\pi f_c$ = angular cutoff frequency
$W_\infty = 2\pi f_\infty$ = angular frequency of peak attenuation
and $$m = \sqrt{1 - \frac{W_\infty^2}{W_c^2}}$$

By selecting a value of $m$ equal to approximately 0.6, the control of impedance for echo return loss purposes is achieved in as much as the impedance is controlled within 20 percent above the design cutoff frequency to better than 5 percent. At the same time, this value of $m$ provides for attenuation below cutoff to provide noise immunity at low frequencies. The frequency response requirement may be met by proper selection of cut off frequency and impedance level. Longitudinal balance requirements can be met by the proper design of the shunt LC structures inductances 30 and 32, capacitor 34 and inductors 46 and 48 and capacitor 50 (FIG. 5). The inductors, which must have high longitudinal balance must also have low distributed capacity to provide against self resonance in-band. This may be achieved with the proper winding of the inductors which requires a "sandwich wound" structure in which half of the inductor 30 (46) is wound first followed by all of the windings of the inductor 32 (48) followed by the second half of the inductor 30 (46) in order to keep the mean length of turn constant, thereby attaining high longitudinal balance, as well as low distributed capacitance. The transformer (T1) which provides the impedance transformation when required can be designed as a very efficient low cost economical transformer inasmuch as capacitors 36 and 44 block the DC normally present on the tip and ring leads, T and R, from entering this transformer. In order to provide low insertion loss, flat frequency response and high echo return loss the transformer T1 should provide low resistance in the primary and secondary winding and high shunt impedance due to the effects of core loss together with low leakage inductance as a function of the coupling coefficient of the transformer.

All of the foregoing requirements can be met in a small structure not carrying DC with a small gap in the magnetic structure to keep the inductance relatively constant with frequency.

The design approach illustrated in FIGS. 2–5 has been implemented and tested in a practical circuit and has performed well. Typical results indicating insertion loss at 1 KHz of 0.25 dB with a frequency response flat to 0.2 dB down to 200 Hz with an upper 3 dB point at 125 KHz. The attenuation at frequencies below cutoff is more than adequate to suppress low frequency noise. The longitudinal balance is in excess of 65 dB across the band and an echo return loss with 900 and 2.16 microfarad terminations in excess of 30 dB has been achieved. The resulting structure is inexpensive, practical and reproducible and accommodates many forms of signaling supervision required. The lightning protection requirement is achieved with the proper selection of capacitors regarding their construction and breakdown requirements which are not severe. By choosing the proper cutoff frequency, the need for tight tolerance components is eliminated.

The introduction of gaps in the magnetic structures provides for linear components and low distortion. The circuit performs efficiently in the presence of the high DC currents imposed because of the design of the magnetic components associated with inductors 30 and 32.

Referring now to FIG. 6, there is shown another transmission bridge, generally designated 100. The structure of the bridge 100 is substantially identical to that of the bridge shown in FIG. 5; however, two varistors 102 and 104 are included in the bridge 100 and are coupled via a relatively small number of windings 106 and 108, respectively, to the cores of the transformers T1 and T2, respectively. Because of the large turns ratios of the windings 30, 32 and 46, 48 to the windings 106 and 108, respectively, the AC impedance of the varistors 102 and 104 is transformed upward, permitting AC signals to be transmitted (without interference from the varistor circuits) between leads T1, R1 and leads T2, R2.

The DC impedances of the varistor circuits are relatively small. When transient signals (such as dial pulse signals experienced in line-to-trunk applications or lightning oriented pulses) are impressed on the leads T1, R1 or T2, R2, the varistors 106 and 108, respectively, conduct, in effect shorting out the primary windings of the transformers T1 and T2, and return the transients to their source via the leads T1, R1 or T1, R2, respectively.

In the case of lightning surges, the potentially destructive transients are returned to their source rather than being transmitted via the bridge to less sensitive components which are susceptible to damage.

Thus, the transmission bridge shown in FIG. 6, in addition to providing the advantages of the transmission bridge shown in FIG. 5, greatly reduces pulse distortion and the possibility of lightning damage, while maintaining the AC linearity which advantageously should be exhibited by the bridge.

While particular embodiments of the present invention have been described above, it will be apparent to those skilled in the art to which the invention pertains that various modifications may be made therein without departing from the spirit and scope of the appended claims.

What is claimed is:

1. A telephone transmission bridge for transmitting alternating current signals comprising first and second input terminals, first and second output terminals, a transformer including a set of primary windings having a first number of turns wound around the transformer core and a set of secondary windings having a second number of turns wound around the transformer core, the set of primary windings being connected in series between the first and second input terminals and the set of secondary windings being connected in series between the first and second output terminals, and variable impedance means coupled to the primary and secondary sets of windings, the variable impedance means being arranged to present an extremely high impedance to alternating current signals and to present an extremely low impedance signal to transient direct current signals, the variable impedance means thereby effectively short circuiting the primary and secondary sets of windings when transient direct current signals are applied to the input and output terminals, respectively, and effectively preventing transient direct current signals from being transmitted between the input terminals and the output terminals and the variable impedance means having a negligible effect on the transmission of alternating current signals between the input terminals and the output terminals.

2. A transmission bridge as claimed in claim 1 wherein the variable impedance means comprises a varistor connected in series with a tertiary set of windings having a third number of turns wound around the transformer core, the third number of turns being substantially smaller than either of the first and second numbers of turns of said primary and secondary sets of windings.

3. A telephone transmission bridge for transmitting alternating current signals comprising:
first and second input terminals,
first and second output terminals,
a first half M type high pass filter section having third and fourth input terminals, connected to the first and second input terminals, respectively, of the transmission bridge, and third and fourth output terminals, an input impedance $Z_{\pi 1}$ and an output impedance $Z_{T1}$,
a first half K type high pass filter section having fifth and sixth input terminals, connected to the third and fourth output terminals, respectively, fifth and sixth output terminals, an input impedance $Z_{TK}$ and an output impedance $Z_{\pi K}$,
a second half K type high pass filter section having seventh and eighth input terminals connected to the fifth and sixth output terminals, respectively, seventh and eighth output terminals, an input impedance $Z_{\pi K}$ and an output impedance $Z_{TK}$,
a second half M type high pass filter section having ninth and tenth input terminals connected to the seventh and eighth output terminals, respectively, ninth and tenth output terminals connected to the first and second output terminals of the transmission bridge, an input impedance $Z_{T1}$ and an output impedance $Z_{\pi 1}$, the values of the electrical components in the half K type sections and the half M type sections being selected so that $Z_{TK} = Z_{T1}$ and $Z_{\pi K} = Z_{\pi 1}$,
a transformer having a set of primary windings with a first number of turns connected in series between the third and fourth input terminals and a set of secondary windings with a second number of turns connected in series between the first and second output terminals, and
variable impedance means coupled to the primary and secondary sets of windings, the variable impedance means being arranged to present an extremely high impedance to alternating current signals and to present an extremely low impedance signal to transient direct current signals, the variable impedance means thereby effectively short circuiting the primary and secondary sets of windings when transient direct current signals are applied to the input and output terminals, respectively, and effectively preventing transient direct current signals from being transmitted between the input terminals and the output terminals and the variable impedance means having a negligible effect on the transmission of alternating current signals between the input terminals and the output terminals.

4. A transmission bridge as claimed in claim 3 wherein the variable impedance means comprises a varistor connected in series with a tertiary set of windings having a third number of turns wound around the transformer core, the third number of turns being substantially smaller than either of the first and second numbers of turns of said primary and secondary sets of windings.

* * * * *